United States Patent
Hsu et al.

(10) Patent No.: US 10,096,878 B2
(45) Date of Patent: Oct. 9, 2018

(54) MICROSTRIP BAND-PASS FILTER HAVING FIRST AND SECOND TRAPEZOIDAL SHAPE COUPLING PORTIONS CONNECTED BY A CONNECTION PORTION

(71) Applicant: HON HAI PRECISION INDUSTRY CO., LTD., New Taipei (TW)

(72) Inventors: Ming-Hsien Hsu, New Taipei (TW); Shii-Rong Den, New Taipei (TW); Su-Feng Li, New Taipei (TW)

(73) Assignee: Cloud Network Technology Singapore Pte. Ltd., Singapore (SG)

(*) Notice: Subject to any disclaimer, the term of this patent is extended or adjusted under 35 U.S.C. 154(b) by 1 day.

(21) Appl. No.: 15/157,336

(22) Filed: May 17, 2016

(65) Prior Publication Data
US 2016/0353574 A1   Dec. 1, 2016

(30) Foreign Application Priority Data
May 27, 2015 (TW) .............................. 104116941 A

(51) Int. Cl.
*H01P 1/203* (2006.01)
*H05K 1/02* (2006.01)
*H05K 1/18* (2006.01)

(52) U.S. Cl.
CPC ...... *H01P 1/20381* (2013.01); *H01P 1/20363* (2013.01); *H05K 1/0243* (2013.01); *H05K 1/182* (2013.01); *H05K 2201/1006* (2013.01)

(58) Field of Classification Search
CPC .............. H01P 1/20327; H01P 1/20354; H01P 1/20363; H01P 1/20381

USPC ........................................................ 333/204
See application file for complete search history.

(56) References Cited

U.S. PATENT DOCUMENTS

| | | | | |
|---|---|---|---|---|
| 5,750,473 A | * | 5/1998 | Shen ...................... | H01P 1/2013 333/204 |
| 5,805,034 A | * | 9/1998 | Evans et al. ........ | H01P 1/20381 333/202 |
| 6,067,461 A | * | 5/2000 | Ye et al. ............. | H01P 1/20363 333/204 |
| 6,370,404 B1 | * | 4/2002 | Shen ................... | H01P 1/20381 333/134 |
| 2001/0024151 A1 | | 9/2001 | Mizoguchi et al. | |
| 2009/0212886 A1 | | 8/2009 | Satoh et al. | |

FOREIGN PATENT DOCUMENTS

| CN | 202084619 U | 12/2011 |
|---|---|---|
| CN | 103035985 A | 4/2013 |
| CN | 104103879 A | 10/2014 |

\* cited by examiner

*Primary Examiner* — Benny Lee
(74) *Attorney, Agent, or Firm* — ScienBiziP, P.C.

(57) ABSTRACT

A band-PASS filter disposed on a printed circuit board comprises a first terminal, a second terminal, a first coupling portion, a second coupling portion and a connection portion. The first terminal and the second terminal are used to receive or output electromagnetic signals respectively. The first coupling portion and the second coupling portion are disposed between the first terminal and the second terminal to couple the electromagnetic signals. The connection portion is connected to the first coupling portion and the second coupling portion. The first terminal partly accommodates in a first coupling portion groove. The second terminal partly accommodates in a second coupling portion groove.

9 Claims, 3 Drawing Sheets

MICROSTRIP BAND-PASS FILTER HAVING FIRST AND SECOND TRAPEZOIDAL SHAPE COUPLING PORTIONS CONNECTED BY A CONNECTION PORTION

FIELD

The subject matter herein generally relates to a filter, particularly relates to a band-pass filter.

BACKGROUND

More and more communication products are applied to a frequency band of 5 gigahertz with the continuous development of the mobile communication technology. Users can have a new experience of the mobile communication. A band-pass filter is an essential component to these products. However, it is hard for developers to design a band-pass filter with a relatively small area but still keep its performance.

SUMMARY

In one aspect of the disclosure, the band-pass filter disposed on a printed circuit board comprises a first terminal, a second terminal, a first coupling portion, a second coupling portion and a connection portion.

The first terminal and the second terminal are used to receive or output signals respectively. The first coupling portion and the second coupling portion are disposed between the first terminal and the second terminal to couple the signals. The connection portion connects to the first coupling portion and the second coupling portion. The first terminal partly accommodates in a first coupling portion groove. The second terminal partly accommodates in a second coupling portion groove.

BRIEF DESCRIPTION OF THE DRAWING

Implementations of the present technology will now be described, by way of example only, with reference to the attached figures, wherein.

DETAILED DESCRIPTION OF THE INVENTION

Figure 1:
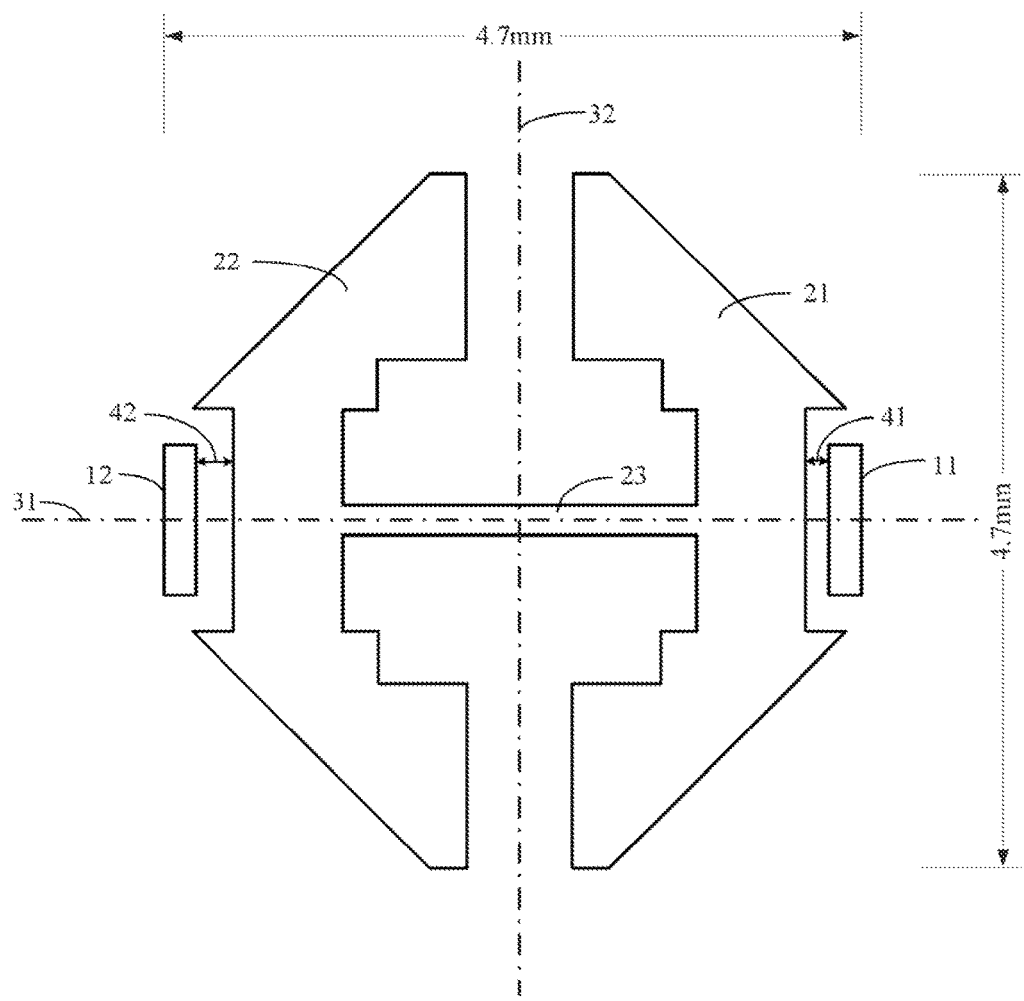
FIG. 1 illustrates a diagrammatic view of one embodiment of a band-pass filter.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description of the invention is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references means "at least one".

Several definitions that apply throughout this disclosure will now be presented. The term "coupled" is defined as "connected", whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a band-pass filter.

FIG. 1 illustrates a diagrammatic view of one embodiment of a band-pass filter.

Referring to FIG. 1, in at least one embodiment, the band-pass filter comprises a first terminal 11, a second terminal 12, a first coupling portion 21, a second coupling portion 22 and a connection portion 23. The first terminal 11 and the second terminal 12 are configured to receive and output electromagnetic signals respectively. The first coupling portion 21 and the second coupling portion 22 are coupled between the first terminal 11 and the second terminal 12 to couple the electromagnetic signals. The connection portion 23 is coupled between the first coupling portion 21 and the second coupling portion 22, and connects the first coupling portion 21 to the second coupling portion 22.

In at least one embodiment, the first terminal 11, the second terminal 12, the first coupling portion 21, the second coupling portion 22 and the connection portion 23 are non-overlapped disposed on the same surface of a printed circuit board (PCB). The first terminal 11 is partly accommodated in a first coupling portion groove. Thus, the first terminal 11 and the first coupling portion 21 define a first gap 41.

The second terminal 12 is partly accommodated in a second coupling portion groove. Thus, the second terminal 12 and the second coupling portion 22 define a second gap 42. In at least one embodiment, a width of the first gap 41 is longer than that of the second gap 42. The first terminal 11 is symmetric about a first axis 31. The second terminal 12 is also symmetric about the first axis 31.

The first coupling portion 21 is symmetric about the first axis 31. The second coupling portion 22 is also symmetric about the first axis 31. The first coupling portion 21 and the second coupling portion 22 are symmetric about a second axis 32. The first axis 31 is perpendicular to the second axis 32.

The connection portion 23 is strip-shaped. The connection portion 23 is coaxial to the first axis 31. When the electromagnetic signals are input to the first terminal 11, the electromagnetic signals would be coupled to the first coupling portion 21 through the first gap 41, then the electromagnetic signals are transmitted to the second coupling portion 22 through the connection portion 23, and then the electromagnetic signals would couple to the second terminal 12 through the second gap 42. Finally, the electromagnetic signals are output from the second terminal 12.

In other embodiments, the first terminal 11, the second terminal 12, the first coupling portion 21, the second coupling portion 22 and the connection portion 23 can be set in different layers of the printed circuit board (PCB). The first terminal 11 and the second terminal 12 are configured to output and receive electromagnetic signals respectively.

Figure 2:
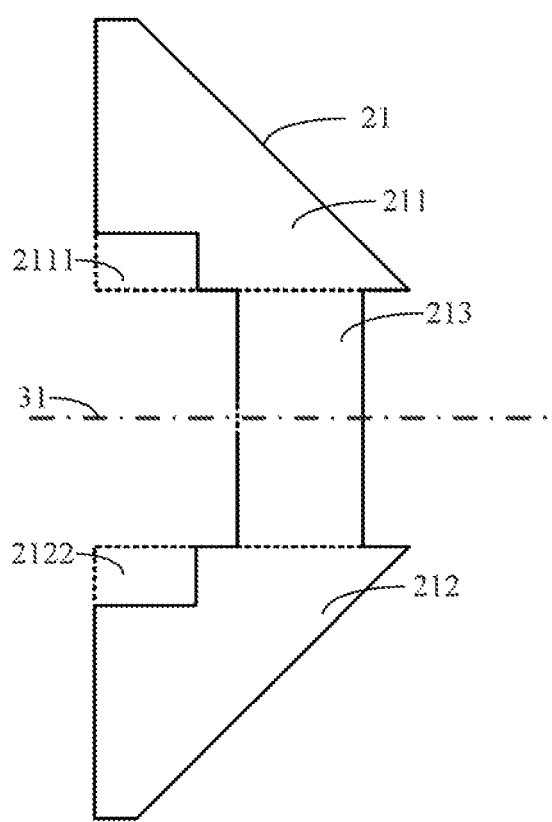
FIG. 2 illustrates a diagrammatic view of one embodiment of a first coupling portion in the band-pass filter.

FIG. 2 illustrates a diagrammatic view of one embodiment of a first coupling portion 21 in the band-pass filter.

In at least one embodiment, shapes of the first coupling portion 21 and the second coupling portion 22 (not shown in FIG. 2) are the same. The first coupling portion 21 and the second coupling portion 22 are symmetric about the first axis 31 and the second axis 32 (see FIG 1). Therefore, we take the first coupling portion 21 for an example to disclose the structures of the first coupling portion 21 and the second coupling portion 22.

In the first coupling portion 21, the first coupling portion 21 comprises a first microstrip line 211, a second microstrip line 212 and a third microstrip line 213. In at least one embodiment, the first microstrip line 211 and the second microstrip line 212 are symmetric about the first axis 31.

In the first microstrip line 211, a shape of the first microstrip line 211 is a first right-angle trapezoid minus a first rectangle portion 2111. A first rectangle portion first edge overlaps with a first right-angle trapezoid bottom edge. A first rectangle portion second edge overlaps with a first right-angle trapezoid right-angle edge. A length of the first rectangle portion first edge is less than a length of the first right-angle trapezoid bottom edge.

In the second microstrip line 212, a shape of the second microstrip line 212 is a second right-angle trapezoid minus a second rectangle portion 2122. A second rectangle portion first edge overlaps with a second right-angle trapezoid top edge. A second rectangle portion second edge overlaps with a second right-angle trapezoid right-angle edge. A length of the second rectangle portion first edge is less than a length of the second right-angle trapezoid top edge.

In the third microstrip line 213, a shape of the third microstrip line 213 is a rectangle. A third microstrip line first edge is coupled to the first right-angle trapezoid bottom edge in the first microstrip line 211. A third microstrip line second edge is coupled to the second right-angle trapezoid top edge in the second microstrip line 212. A third microstrip line third edge defines a middle part. The middle part is coupled to the connection portion 23 (see FIG. 1). The first coupling portion groove is enclosed by the first microstrip line 211, the second microstrip line 212 and the third microstrip line 213. The first terminal 11 is partly accommodated in the first coupling portion groove (not shown in FIG. 2). Further, the first terminal 11 extends from the first coupling portion groove (as shown in FIG. 1). The second terminal 12 is partly accommodated in the second coupling portion groove (not shown in FIG. 2). Further, the second terminal 12 extends from the second coupling portion groove (as shown in FIG. 1).

In at least one embodiment, the band-pass filter can be set in an area multiplied 4.7 millimeters by 4.7 millimeters (as shown in FIG. 1). The band-pass filter occupies a small space. Thus, the band-pass filter meets requirements of miniaturization designs.

Figure 3:
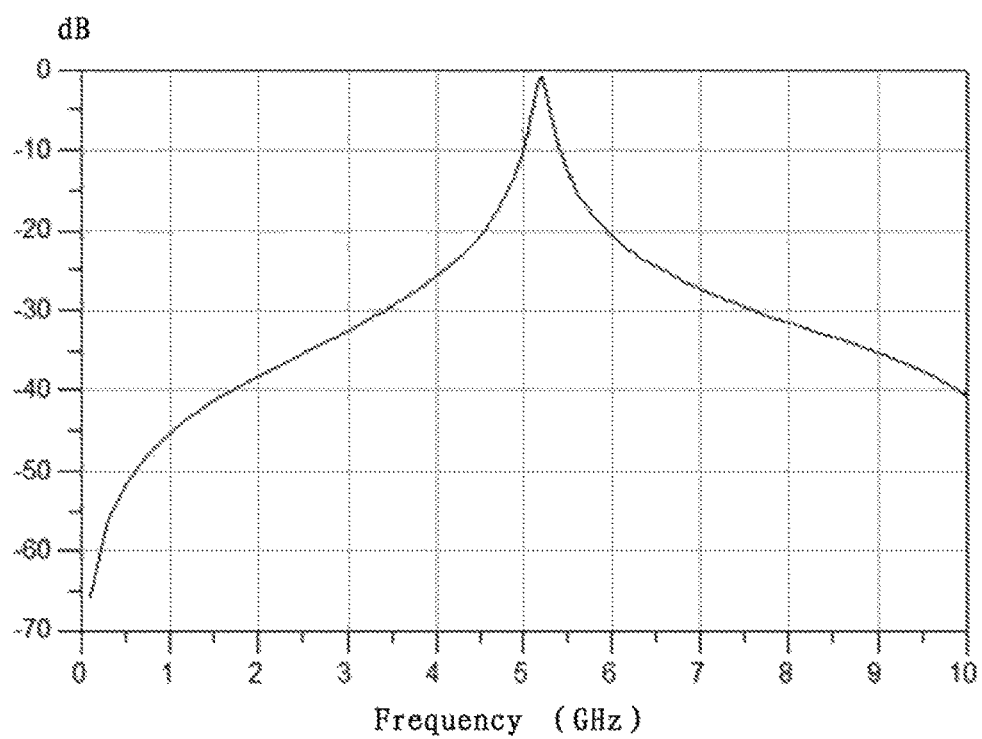
FIG. 3 illustrates a diagrammatic view of transmission coefficient characteristics of one embodiment of the band-pass filter.

FIG. 3 illustrates a diagrammatic view of transmission coefficient characteristics of one embodiment of the band-pass filter.

A working frequency band of the band-pass filter is a band in GHz with transmission coefficient less than −3 decibels (dB). According to the characteristics in FIG. 3, a center frequency of the working frequency band is probably 5.207 gigahertz (Ghz). The bandwidth of the working frequency band is 124 megahertz (Mhz). Thus, the band-pass filter disclosed in the embodiment has good performances with magnitudes being greater than −10 dB working in the frequency band of 5 gigahertz mobile communication technology.

As the embodiment disclosed above, the band-pass filter has good performance and occupies a small space. The band-pass filter is suitable to work in products used in a frequency band of 5 gigahertz mobile communication technology.

Many details are often found in art including other features of the band-pass filter. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A band-pass filter disposed on a PCB comprising:
   a first terminal and a second terminal, configured to receive and output electromagnetic signals respectively;
   a first coupling portion with a first coupling portion groove and a second coupling portion with a second coupling portion groove, coupled to the first terminal and the second terminal, respectively; and
   a connection portion, connected the first coupling portion to the second coupling portion;
   wherein the first terminal is partly accommodated in the first coupling portion groove, and the second terminal is partly accommodated in the second coupling portion groove;
   wherein a first gap is defined between the first terminal and the first coupling portion, and a second gap defined between the second terminal and the second coupling portion, and a width of the first gap exceeds a width of the second gap.

2. The band-pass filter as claimed in claim 1, wherein the first terminal is symmetric about an axis, and the second terminal is also symmetric about the axis.

3. The band-pass filter as claimed in claim 1, wherein the first coupling portion is symmetric about a first axis, the second coupling portion is also symmetric about the first axis, the first coupling portion and the second coupling portion are symmetric about a second axis, and the first axis is perpendicular to the second axis.

4. The band-pass filter as claimed in claim 3, wherein the connection portion is strip-shaped and the connection portion is coaxial to the first axis.

5. The band-pass filter as claimed in claim 3, wherein each of the first coupling portion and the second coupling portion comprises:
   a first microstrip line, wherein a shape of the first microstrip line is a first right-angle trapezoid minus a first rectangle portion; wherein the first rectangle portion has a first rectangle portion first edge and a first rectangle portion second edge, the first right-angle trapezoid has a first right-angle trapezoid bottom edge and a first right-angle trapezoid right-angle edge, and the first rectangle portion first edge overlaps with the first right-angle trapezoid bottom edge; the first rectangle portion second edge overlap with the first right-angle trapezoid right-angle edge;

a second microstrip line, wherein the second microstrip line is a second right-angle trapezoid minus a second rectangle portion; wherein the second rectangle portion has a second rectangle portion first edge and a second rectangle portion second edge, the second right-angle trapezoid has a second right-angle trapezoid top edge and a second right-angle trapezoid right-angle edge, and the second rectangle portion first edge overlaps with the second right-angle trapezoid top edge, the second rectangle portion second edge overlaps with the second right-angle trapezoid right-angle edge; and a third microstrip line has a third microstrip line first edge and a third microstrip line second edge, wherein the third microstrip line first edge is coupled to the first right-angle trapezoid bottom edge, and the third microstrip line second edge is coupled to the second right-angle trapezoid top edge, and a third microstrip line third edge defines a middle part, and the middle part is coupled to the connection portion.

6. The band-pass filter as claimed in claim 5, wherein the third microstrip line has a shape that is a rectangle-shaped.

7. The band-pass filter as claimed in claim 5, wherein the first microstrip line and the second microstrip line are symmetric about the first axis.

8. The band-pass filter as claimed in claim 5, wherein the first coupling portion groove is defined by the first microstrip line, the second microstrip line and the third microstrip line in the first coupling portion; and the second coupling portion groove is defined by the first microstrip line, the second microstrip line and the third microstrip line in the second coupling portion; the first terminal and the third microstrip line define a first gap there between, and the second terminal and the third microstrip line define a second gap there between.

9. The band-pass filter as claimed in claim 8, wherein the first terminal extends out from the first coupling portion groove, and the second terminal extends out from the second coupling portion groove.

\* \* \* \* \*